United States Patent
Ohnishi et al.

(10) Patent No.: US 9,142,750 B2
(45) Date of Patent: Sep. 22, 2015

(54) PIEZOELECTRIC ELEMENT WITH ELECTRODES ALLOWING SUBSTRATE STRAIN AND METHOD FOR MANUFACTURING THE SAME

(71) Applicant: NGK INSULATORS, LTD, Nagoya, Aichi-prefecture (JP)

(72) Inventors: Takao Ohnishi, Nagoya (JP); Hideki Shimizu, Nagoya (JP); Masayuki Uetani, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 284 days.

(21) Appl. No.: 13/770,261

(22) Filed: Feb. 19, 2013

(65) Prior Publication Data
US 2013/0214647 A1 Aug. 22, 2013

(30) Foreign Application Priority Data
Feb. 21, 2012 (JP) ................. 2012-034937

(51) Int. Cl.
  *H01L 41/047* (2006.01)
  *H01L 41/29* (2013.01)
(52) U.S. Cl.
  CPC .............. *H01L 41/047* (2013.01); *H01L 41/29* (2013.01); *Y10T 29/42* (2015.01)
(58) Field of Classification Search
  CPC .................................................... H01L 41/047
  USPC ........................................................ 310/364
  See application file for complete search history.

(56) References Cited

U.S. PATENT DOCUMENTS

| | | | | |
|---|---|---|---|---|
| 5,755,909 | A * | 5/1998 | Gailus | 156/229 |
| 7,481,120 | B2 * | 1/2009 | Gravesen et al. | 73/862.042 |
| 7,548,015 | B2 * | 6/2009 | Benslimane et al. | 310/367 |
| 7,656,077 | B2 * | 2/2010 | Hira et al. | 310/363 |
| 8,891,222 | B2 * | 11/2014 | Benslimane | 361/286 |
| 2007/0272912 | A1 | 11/2007 | Onishi et al. | |
| 2010/0060110 | A1 * | 3/2010 | Inagaki et al. | 310/366 |
| 2010/0078505 | A1 * | 4/2010 | Kato | 239/546 |
| 2010/0276511 | A1 * | 11/2010 | Okamura | 239/102.2 |
| 2010/0282874 | A1 * | 11/2010 | Nakamura et al. | 239/585.1 |
| 2011/0056059 | A1 | 3/2011 | Shimizu et al. | |
| 2014/0055932 | A1 * | 2/2014 | Nakamura | 361/679.01 |

FOREIGN PATENT DOCUMENTS

| | | |
|---|---|---|
| EP | 1 372 199 A1 | 12/2003 |
| EP | 2 495 778 A2 | 9/2012 |
| JP | 2005-051840 A1 | 2/2005 |
| JP | 2005-072325 | 3/2005 |

OTHER PUBLICATIONS

Extended European Search Report (Application No. 13155729.0) dated Aug. 20, 2014.

* cited by examiner

*Primary Examiner* — J. San Martin
(74) *Attorney, Agent, or Firm* — Burr & Brown, PLLC (57) ABSTRACT

A piezoelectric element is provided with a ceramic substrate including a first surface on which a groove is formed, and a first electrode formed on the first surface of the ceramic substrate and including a crossing part that extends over the groove. At least one void is formed between a bottom of the groove and the crossing part of the first electrode.

16 Claims, 8 Drawing Sheets

| | Method for Forming Electrode | Amount of Strain (nm/V) | | | C-axis Domain Orientation Ratio | | |
|---|---|---|---|---|---|---|---|
| | | No High Temperature Aging Test is Performed | High Temperature Aging Test is Performed | Rate of Change | No High Temperature Aging Test is Performed | High Temperature Aging Test is Performed | Amount of change |
| First Comparative Example | Sputtering | 3.5 | 3.1 | −11% | 35% | 44% | 9% |
| Second Comparative Example | Sputtering (Heat Substrate at 230°C) | 3.1 | 2.8 | −8% | 45% | 48% | 3% |
| Embodiment | Au Resinate (600°C) | 3.6 | 3.6 | 0% | 42% | 41% | −1% |

FIG. 9

PIEZOELECTRIC ELEMENT WITH ELECTRODES ALLOWING SUBSTRATE STRAIN AND METHOD FOR MANUFACTURING THE SAME

CROSS-REFERENCE TO RELATED APPLICATION

This application claims priority to Japanese Patent Application No. 2012-034937 filed on Feb. 21, 2012, the contents of which are hereby incorporated by reference into the present application.

BACKGROUND OF THE INVENTION

1. Field of the Invention

The present application relates to a piezoelectric element.

2. Description of Related Art

A piezoelectric element includes a ceramic substrate and electrodes formed on respective surfaces of the ceramic substrate. When an external force is applied to the ceramic substrate of the piezoelectric element, the ceramic substrate is strained and a voltage is generated between the electrodes (piezoelectric effect). Furthermore, when a voltage is applied between the electrodes of the piezoelectric element, an electric field is applied to the ceramic substrate to strain the ceramic substrate (inverse piezoelectric effect). Note that a piezoelectric element having a plurality of internal electrodes has been disclosed in Japanese Patent Application Publication No. 2005-72325.

SUMMARY OF THE INVENTION

When the above-described piezoelectric effect or inverse piezoelectric effect is obtained, strain of the ceramic substrate is interrupted by rigidity of the electrodes formed on the respective surfaces of the ceramic substrate. This causes a problem in that an amount of strain of the ceramic substrate is reduced and the piezoelectric element becomes less likely to be strained. For example, when the piezoelectric effect is to be obtained in a case where the piezoelectric element is less likely to be strained, a voltage to be generated becomes small with respect to a force to be applied to the piezoelectric element. Furthermore, when the inverse piezoelectric effect is to be obtained in the case where the piezoelectric element is less likely to be strained, an amount of strain to be generated becomes small with respect to a voltage to be applied to the piezoelectric element. Accordingly, the present description provides a piezoelectric element having an electrode that is less likely to interrupt strain of a ceramic substrate.

A piezoelectric element disclosed in the present description comprises a ceramic substrate including a first surface on which a groove is formed, and a first electrode formed on the first surface of the ceramic substrate and including a crossing part that extends over the groove. At least one void is formed between a bottom of the groove and the crossing part of the first electrode.

In the piezoelectric element, the void is formed between the bottom of the groove and the electrode. That is, the electrode is not in contact with the ceramic substrate at the bottom of the groove. A part of the electrode which is not in contact with the ceramic substrate can be flexibly deformed as compared with a part of the electrode which is in contact with the ceramic substrate. Consequently, strain of the ceramic substrate is less likely to be interrupted by the electrode. Accordingly, the piezoelectric element is readily strained.

The present description provides a new method for manufacturing a piezoelectric element. The method comprises forming, on a surface of a ceramic substrate which includes a groove, an electrode such that the electrode includes a crossing part that extends over the groove, and detaching the crossing part of the electrode from the bottom of the groove by heating the ceramic substrate.

According to the manufacturing method, a piezoelectric element having an electrode which is not in contact with a ceramic substrate at a crossing part that extends over a groove can be manufactured.

DETAILED DESCRIPTION OF INVENTION

In one aspect of the present teachings, microscopic voids smaller than the at least one void at the bottom of the groove may be formed inside the first electrode.

According to the structure, a whole of the electrode can be more flexibly deformed. Therefore, a piezoelectric element which is more readily strained can be obtained.

In another aspect of the present teachings, a volume ratio of the microscopic voids inside the first electrode at the crossing part may be higher than the volume ratio of the microscopic voids inside the first electrode at a part other than the crossing part.

According to the structure, the electrode at the crossing part that extends over the groove can be more flexibly deformed. Therefore, a piezoelectric element which is more readily strained can be obtained.

In another aspect of the present teachings, a thickness of the first electrode may be 50 nanometers or more and 500 nanometers or less.

According to the structure, the thickness of the electrode is sufficiently thin, so that the electrode can be more flexibly deformed. Therefore, a piezoelectric element which is more readily strained can be obtained.

In another aspect of the present teachings, the groove may be a groove that is formed on a surface of the ceramic substrate that is fired when the ceramic substrate is fired.

The groove is naturally formed on a surface of the ceramic substrate that is fired when the ceramic substrate is fired. Using the groove enables easy formation of the void.

In another aspect of the present teachings, the groove may be formed along a boundary between crystal grains which are exposed on the first surface of the ceramic substrate.

In another aspect of the present teachings, the piezoelectric element may be used as an actuator which makes use of a strain in a d31 direction.

In another aspect of the present teachings, the ceramic substrate may include a second surface opposite to the first surface on which a groove is formed. The piezoelectric element may comprise a second electrode which is formed on the second surface of the ceramic substrate and is including a crossing part that extends over the groove on the second surface. At least one void may be formed between a bottom of the groove on the second surface and the crossing part of the second electrode.

According to the structure, the ceramic substrate is sandwiched between a pair of electrodes. Since both of the pair of electrodes can be flexibly deformed, a piezoelectric element which is more readily strained can be obtained.

In another aspect of the present teachings, a direction in which the pair of electrodes is faced to each other may be a thickness direction of the ceramic substrate. That is, the pair of electrodes may be electrodes that generate a highest electric field among electric field to be applied to the ceramic substrate. For example, the piezoelectric element that uses strain in a d33 direction may be equipped with a plurality of internal electrodes. An electrode (wire) for connecting the internal electrodes to each other is formed at an end surface of such a piezoelectric element. The above-described pair of electrodes is different from the electrode formed at the end surface of the piezoelectric element that uses strain in the d33 direction.

In the other aspect of the present teachings, the void between the bottom of the groove and the electrode may be extended along the groove.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved piezoelectric elements, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiment

Figure 1:
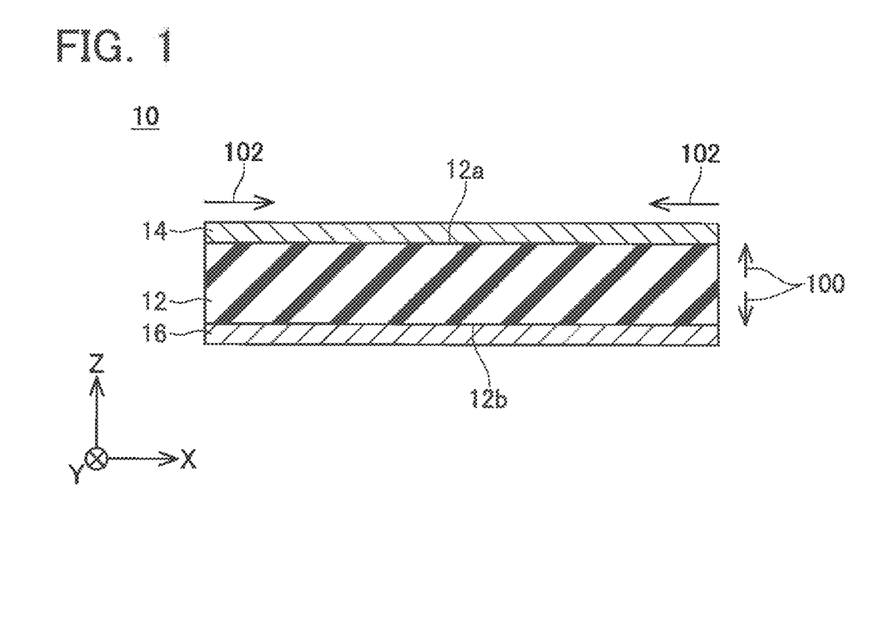
FIG. 1 shows a vertical cross-sectional view of a piezoelectric element 10 in an embodiment.

As illustrated in FIG. 1, a piezoelectric element 10 of an embodiment includes a ceramic substrate 12, an electrode 14, and an electrode 16. The electrode 14 is formed on an upper surface 12a of the ceramic substrate 12. The electrode 16 is formed on a lower surface 12b of the ceramic substrate 12. The ceramic substrate 12 is constituted by a piezoelectric body. Note that, hereinafter, a thickness direction of the ceramic substrate 12 may be referred to as a Z direction, a direction perpendicular to the Z direction (a direction along the upper surface of the ceramic substrate 12) may be referred to as an X direction, and a direction perpendicular to both of the X direction and the Z direction may be referred to as a Y direction. Note that, the piezoelectric element 10 is subjected to a polarization treatment by an electric field oriented toward the electrode 16 from the electrode 14.

When a voltage is applied between the electrode 14 and the electrode 16 such that the electrode 14 becomes a high electric potential, an electric field is applied to the ceramic substrate 12 in the Z direction. This expands the ceramic substrate 12 in the Z direction as shown by arrows 100, and shrinks the ceramic substrate 12 in the X direction and the Y direction as shown by arrows 102. The piezoelectric element 10 is used as an actuator which makes use of strain in the X direction. That is, the piezoelectric element 10 is a piezoelectric element which makes use of strain in a d31 direction in which the direction of the electric field applied to the ceramic substrate 12 (that is, the Z direction) and the direction of the strain used for driving the actuator (that is, the X direction) are approximately perpendicular.

Figure 2:
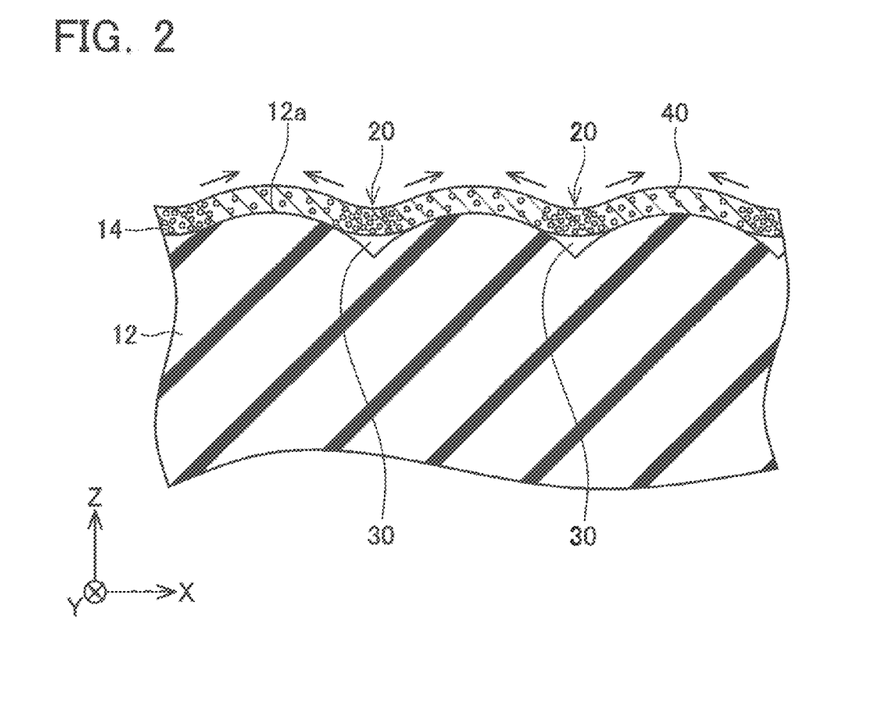
FIG. 2 shows an enlarged cross-sectional view of a boundary between an electrode 14 and a ceramic substrate 12.
Figure 3:
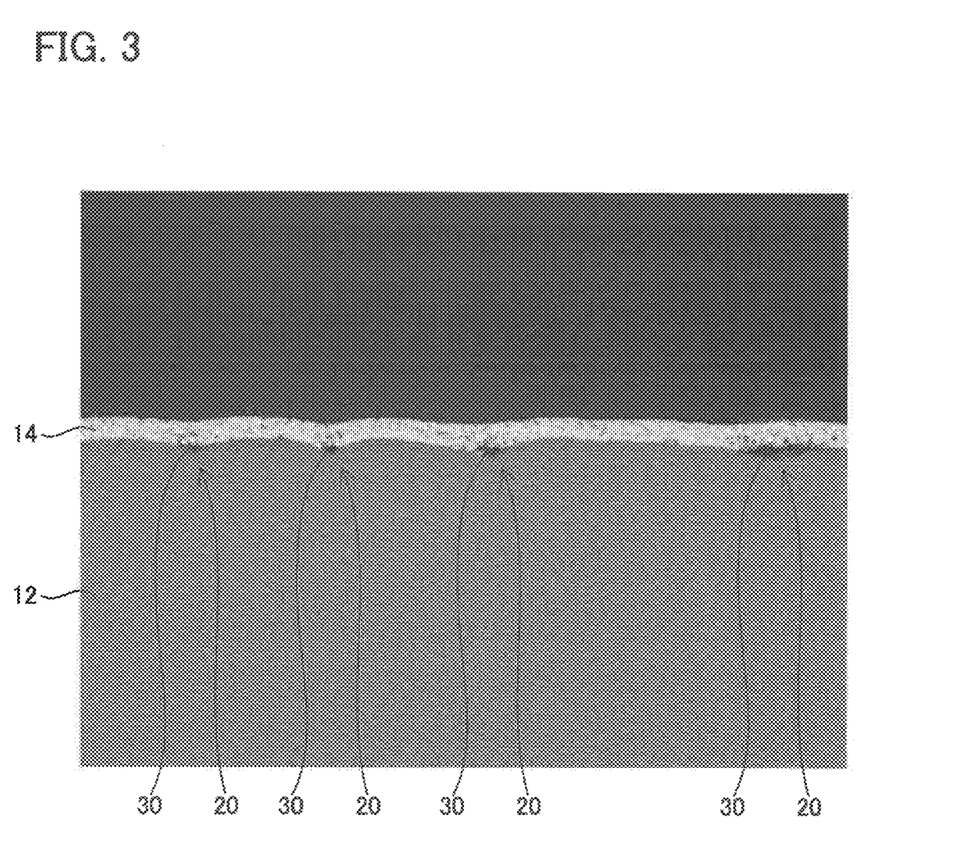
FIG. 3 shows an electron microscopic photograph which corresponds to FIG. 2.
Figure 4:
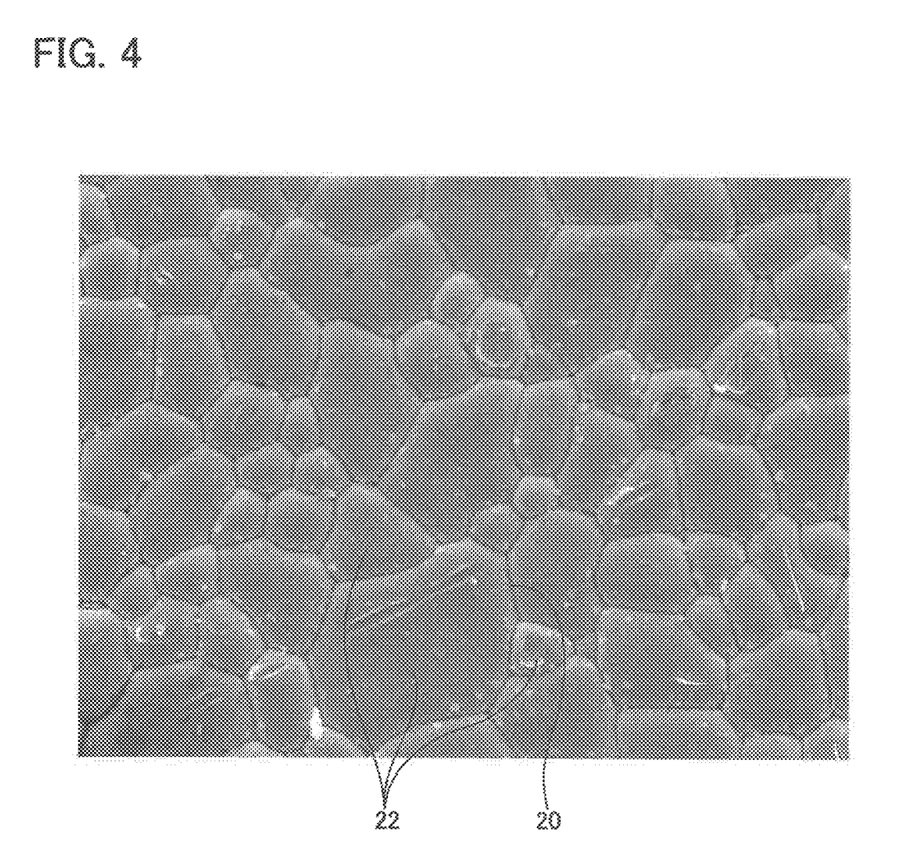
FIG. 4 shows an electron microscopic photograph of an upper surface 12a of a ceramic substrate 12.

FIG. 2 is a vertical cross-sectional view of the piezoelectric element 10, and shows an enlarged boundary between the ceramic substrate 12 and the electrode 14. FIG. 3 shows an electron microscopic photograph of the piezoelectric element 10 in an area corresponding to FIG. 2. As shown in FIGS. 2 and 3, many grooves 20 are formed on the upper surface 12a of the ceramic substrate 12. FIG. 4 shows an electron microscopic photograph of the upper surface 12a of the ceramic substrate 12. Many crystal grains 22 exist in the ceramic substrate 12, and as shown in FIG. 4, the crystal grains 22 are exposed on the upper surface 12a of the ceramic substrate 12. Each of the grooves 20 is formed along a boundary of the crystal grains 22 (grain boundary) exposed on the upper surface 12a of the ceramic substrate 12. The grooves 20 are formed on a surface of the ceramic substrate 12 that is fired in a process for firing the ceramic substrate 12. "The surface that is fired" herein is not specifically limited to a particular surface as long as the surface of the ceramic substrate 12 is fired in the above-described fixing process, and may be used in both of a case where the fired surface denotes only the upper surface 12a of the ceramic substrate 12 and a case where the fired surface denotes both of the upper surface 12a and the lower surface 12b of the ceramic substrate 12.

As shown in FIGS. 2 and 3, the electrode 14 is formed along irregularities of the upper surfaces 12a of the ceramic substrate 12. However, the electrode 14 is not in contact with respective bottoms of the grooves 20. Note that, the bottom of the groove 20 means a surface of the deepest part of the groove 20. Voids 30 are formed between the electrode 14 and the respective bottoms of the grooves 20. The void 30 extends along the groove 20. A width of each of the voids 30 (width in a direction parallel to the upper surface 12a of the ceramic substrate 12 (size in the X direction in FIG. 2)) is about 260 nanometers to 500 nanometers and an average value thereof is about 330 nanometers. A depth of each of the voids 30 (size in the Z direction) is about 54 nanometers to 110 nanometers, and an average value thereof is about 80 nanometers. A thickness of the electrode 14 is about 100 nanometers to 370 nanometers.

Many microscopic voids 40 are formed inside the electrode 14. The microscopic voids 40 are voids having respective diameters of about 20 nanometers to 80 nanometers. A volume of the microscopic void 40 is far smaller than a volume of the void 30 formed on the bottom of the groove 20. Note that a size of the microscopic void 40 is different depending on a position. The diameter of the microscopic void 40 inside the electrode 14 at a crossing part that extends over the groove 20 (that is, the electrode 14 at a part above the void 30) is about 30 nanometers to 80 nanometers, and an average value of the diameter is about 45 nanometers. On the other hand, the diameter of the microscopic void 40 inside the electrode 14 at a part other than the crossing part (the electrode 14 at a part in contact with the ceramic substrate 12) is about 20 nanometers to 60 nanometers, and an average value of the diameter is about 35 nanometers. That is, the average value of the diameter of the microscopic voids 40 inside the electrode 14 at the crossing part extending over the groove 20 is larger than that at the part other than the crossing part. Furthermore, a volume ratio of the microscopic voids 40 inside the electrode 14 at the crossing part is higher than that at the part other than the crossing part. The volume ratio of the microscopic voids 40 inside the electrode 14 at the crossing part extending over the groove 20 is about 8%. On the other hand, the volume ratio of the microscopic voids 40 inside the electrode 14 at the part other than the crossing part is about 4%.

The electrode 16 on the side of the lower surface 12b of the ceramic substrate 12 is formed in the approximately same manner as the electrode 14 on the side of the upper surface 12a thereof. That is, many grooves 20 are formed also on the lower surface 12b of the ceramic substrate 12, and the electrode 16 is formed to cross the grooves 20 on the lower surface 12b. Voids 30 are formed between respective bottoms of the grooves 20 on the lower surface 12b and the electrode 16. Furthermore, microscopic voids 40 are formed inside the electrode 16. A size of the microscopic void 40 inside the electrode 16 is far smaller than a size of the void 30 between the electrode 16 and the bottom of the groove 20. Sizes and a volume ratio of the microscopic voids 40 of the electrode 16 at a crossing part that extends over the groove 20 are larger and higher than those at a part other than the crossing part.

Figure 5:
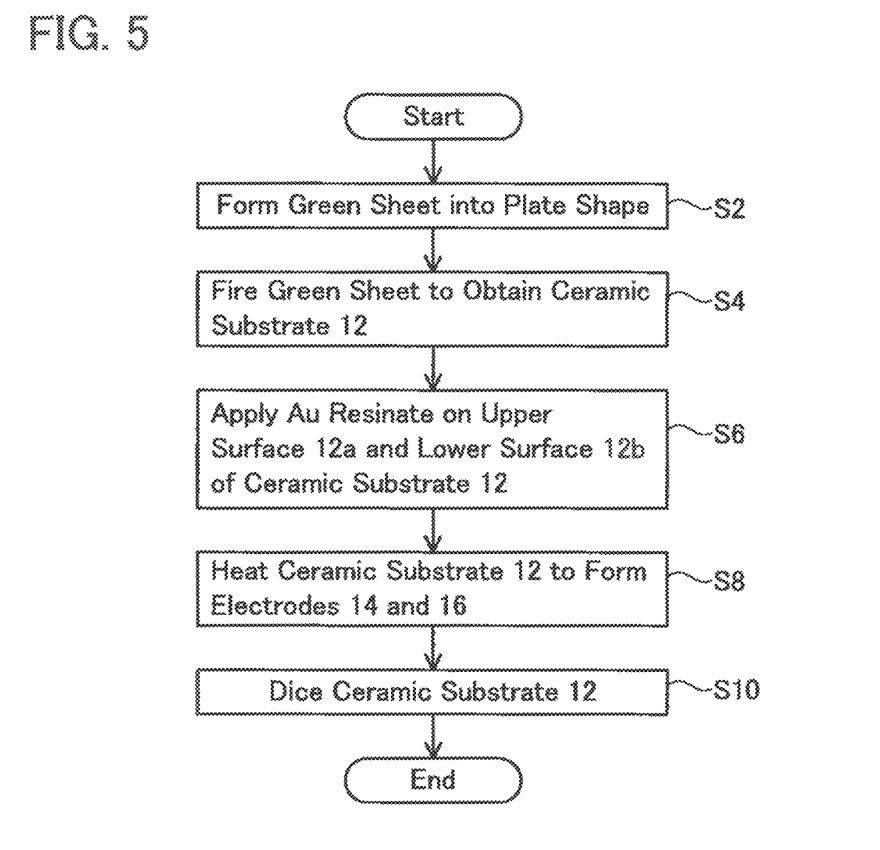
FIG. 5 shows a flow chart of a method for manufacturing the piezoelectric element 10.

Next, a method for manufacturing the piezoelectric element 10 will be described. FIG. 5 is a flow chart showing the method for manufacturing the piezoelectric element 10. First, a green sheet whose main substance is a piezoelectric body is formed into a plate shape in step S2. Herein, a surface of the green sheet is formed to be approximately flat. In step S4, the green sheet is heated. This removes a solvent from the green sheet and fires the green sheet to obtain the ceramic substrate 12. During firing the green sheet, the ceramic substrate 12 is polycrystallized to form crystal grains in the ceramic substrate 12. This forms the grooves 20 on the surface of the ceramic substrate 12. Surface roughness Ra of the ceramic substrate 12 at this time becomes 0.01 micrometers to 0.1 micrometers.

In step S6, an Au resinate is uniformly applied on the upper surface 12a and the lower surface 12b of the ceramic substrate 12. In the embodiment, the Au resinate is applied by a screen print or spin coat method. Then, an organic solvent is vaporized by drying to form a dried film of Au resinate. Note that the Au resinate is a paste consisting of an organic metallic compound in which Au (gold) is dissolved in an organic solvent. Furthermore, a small amount of glass component is added to the Au resinate so that an Au film to be described below is suitably fixed on the ceramic substrate 12. Note that although an example in which the Au resinate is used is described in the embodiment, a resinate including Pt (platinum) or Cu (copper) may be used as an organic metal compound.

In step S8, the ceramic substrate 12 is heated using a belt firing furnace. The belt firing furnace is a firing furnace configured so that the ceramic substrate 12 passes through the furnace. When the ceramic substrate 12 is moved in the furnace, the ceramic substrate 12 is heated at a predetermined temperature profile. The highest temperature in the belt firing furnace is set at about 600° C. When the ceramic substrate 12 is entered into the belt firing furnace, the temperature of the ceramic substrate 12 is increased and is maintained at a temperature of about 600° C. for a predetermined time. An organic component in the Au resinate is removed during increasing the temperature. Then, when the temperature of the ceramic substrate 12 reaches the highest temperature of about 600° C., the glass is melted and Au is sintered to form Au films on the respective upper surface 12a and lower surface 12b of the ceramic substrate 12. The Au films are the electrodes 14 and 16. By removing the organic component in the Au resinate, the electrodes 14 and 16 having a thickness of about 100 nanometers to 370 nanometers and having many microscopic voids 40 thereinside can be formed. When the electrodes 14 and 16 are heated in the belt firing furnace, it is considered that the electrodes 14 and 16 are deformed as described below. That is, when the electrodes 14 and 16 are heated, as described above, the organic component in the electrodes 14 and 16 is removed and many relatively large microscopic voids 40 are formed in the electrodes 14 and 16. Then, when the electrodes 14 and 16 are heated to about 600° C., Au atoms are sintered inside the electrodes 14 and 16, so that the electrodes 14 and 16 are shrunk. With the shrinkage of the electrodes 14 and 16, the microscopic voids 40 become small and the number of the microscopic voids 40 is reduced. Furthermore, the thickness of the electrodes 14 and 16 is reduced when the shrinkage of the electrodes 14 and 16 progresses. In this context, since sintering of the electrodes 14 and 16 is advanced toward a high part surrounded by the grooves 20 of the ceramic substrate 12, shrinking also occurs toward directions apart from the grooves 20 as shown by the arrows of FIG. 2. As a result, the electrodes 14 and 16 in the grooves 20 are detached from the bottoms of the grooves 20 to form the voids 30. Furthermore, since the electrodes 14 and 16 are shrunk in this manner, the microscopic voids 40 which were once reduced in their size are enlarged in the electrodes 14 and 16 at the parts crossing the respective grooves 20. Consequently, the volume ratio of the microscopic voids 40 inside the electrodes 14 and 16 at the parts crossing the respective grooves 20 is increased.

Note that as the highest temperature is increased in step S8, a ratio of microscopic voids 40 that connect each other increases. Furthermore, a ratio of microscopic voids 40 penetrating the electrodes 14 and 16 and communicating with voids 30 and outside of the electrodes 14 and 16 increases. Consequently, a ratio of the upper surface 12a and lower surface 12b of the ceramic substrate 12 exposed to the outside of the electrodes 14 and 16 through microscopic voids 40 increases.

In step S10, the ceramic substrate 12 is diced to divide into a plurality of piezoelectric elements 10. In this manner, the above-described piezoelectric element 10 is manufactured.

Figure 6:
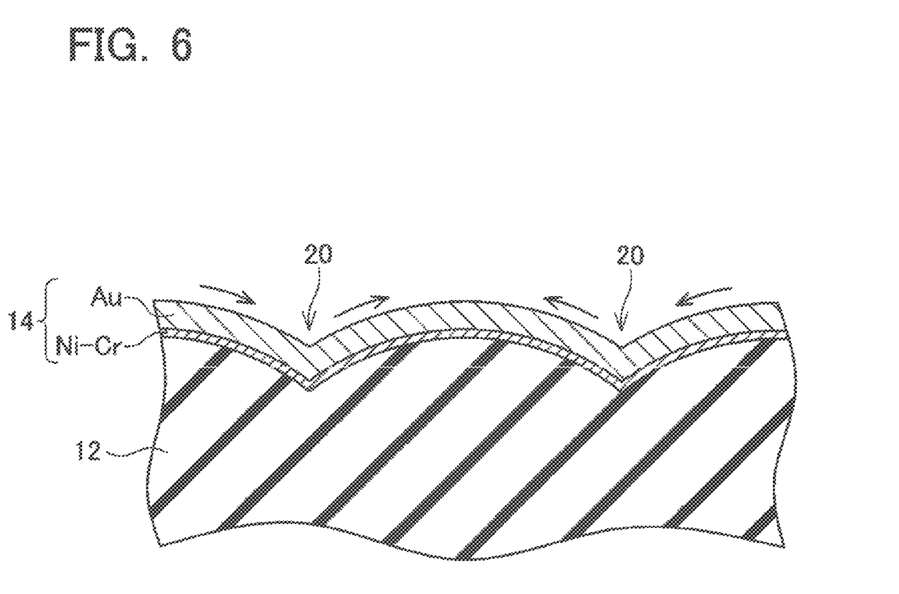
FIG. 6 shows an enlarged cross-sectional view of a boundary between an electrode 14 and a ceramic substrate 12 in a comparative example.
Figure 7:
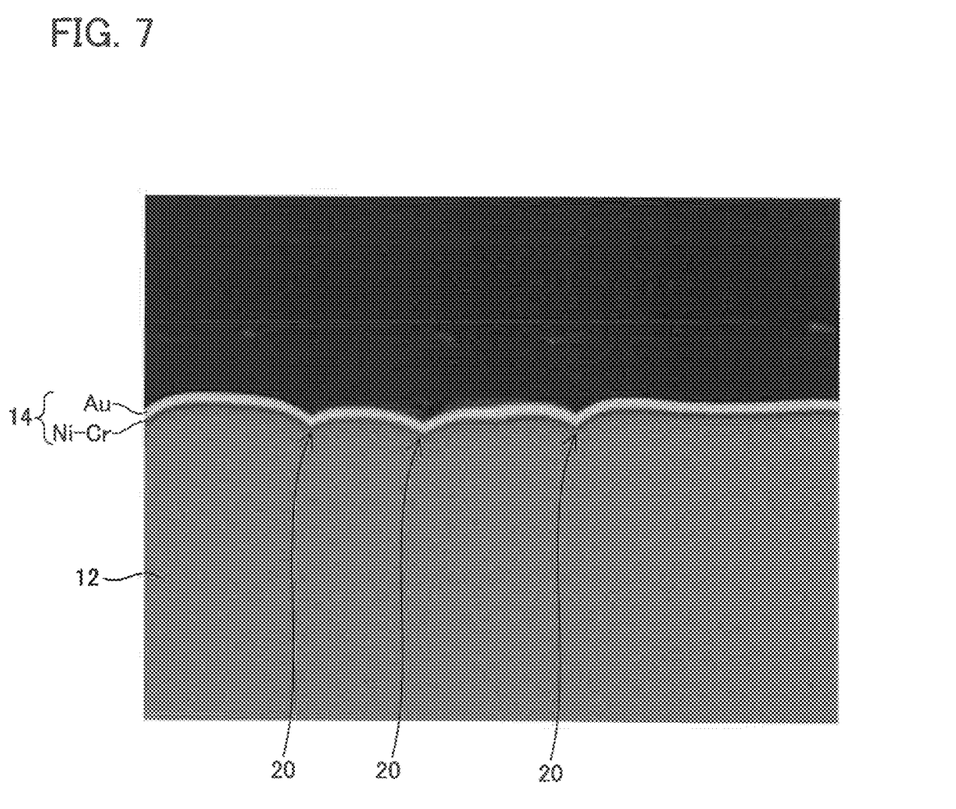
FIG. 7 shows an electron microscopic photograph which corresponds to FIG. 6.

Next, characteristics of the piezoelectric element according to the embodiment will be described in comparison with piezoelectric elements according to first and second comparative examples. FIGS. 6 and 7 each show a vertical cross-section of a piezoelectric element according to first or second comparative example (cross-sectional structures of the respective piezoelectric elements according to the first and second comparative examples are approximately the same). In the piezoelectric elements according to the first and second comparative examples, the electrodes 14 and 16 are formed by subjecting the ceramic substrate 12 that is the same as that of the piezoelectric element according to the embodiment to a sputtering treatment. Note that each of the electrodes 14 and 16 is formed of a Ni—Cr film (film of an alloy of nickel and chrome) formed on the ceramic substrate 12 and an Au film formed on the Ni—Cr film. Furthermore, in the piezoelectric element according to the first comparative example, the electrodes 14 and 16 are formed by performing a sputtering at approximately a normal temperature, whereas in the piezoelectric element according to the second comparative example, the electrodes 14 and 16 are formed by performing a sputtering while heating the ceramic substrate 12 at about 230° C. According to the sputtering, as shown in FIGS. 6 and 7, the electrodes 14 and 16 adhered tightly to the whole surfaces of the ceramic substrate 12 including the grooves 20 are formed. That is, no void 30 is formed on the groove 20 in the piezoelectric element 10 according to the first and second comparative examples. Furthermore, according to the sputtering, the electrodes 14 and 16 which are dense can be formed. That is, no microscopic void 40 is formed in the electrodes 14 and 16 of the piezoelectric element 10 according to the first and second comparative examples.

Figure 8:
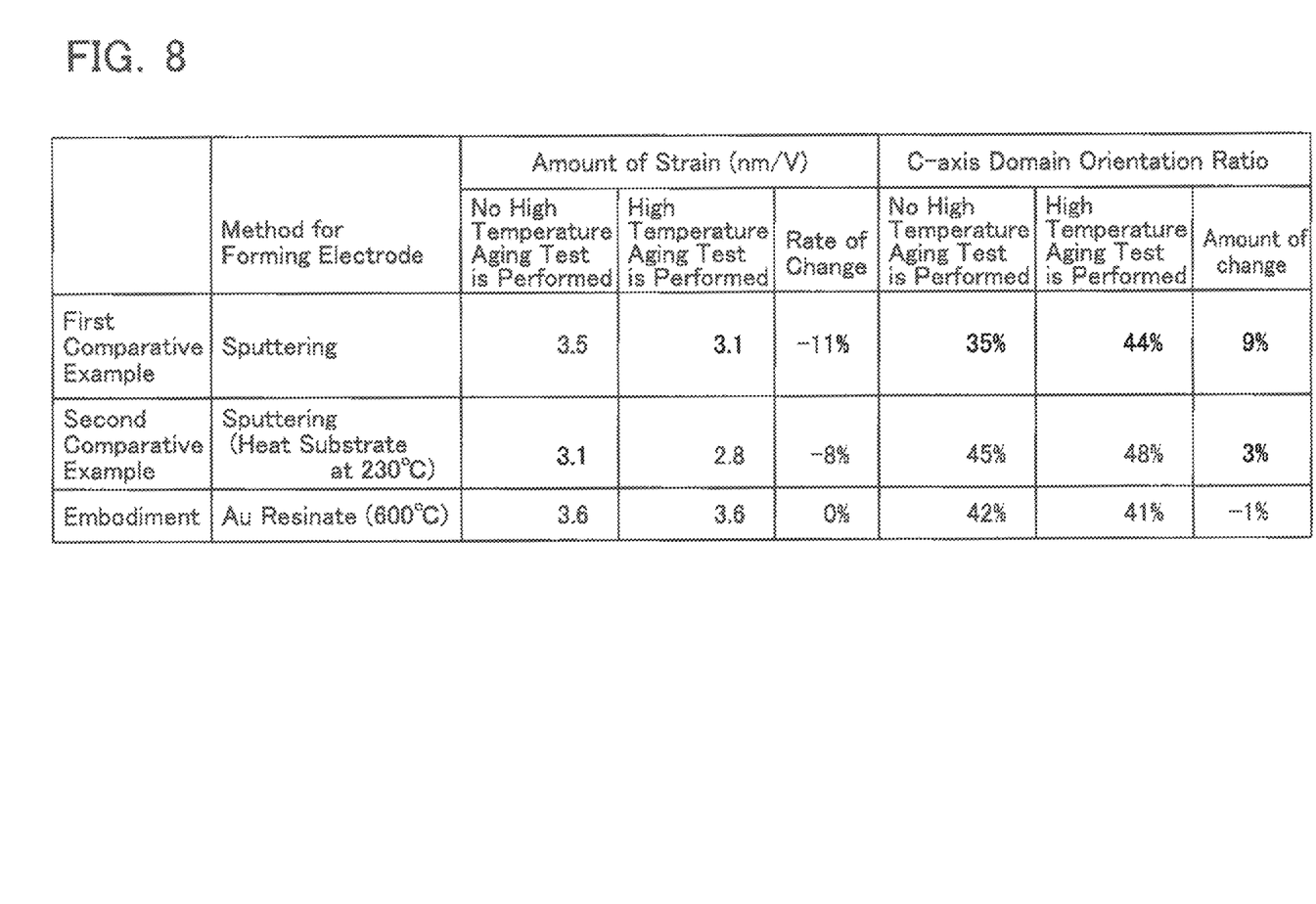
FIG. 8 shows a table of an evaluation result of each piezoelectric element.

FIG. 8 shows an evaluation result of a c-axis domain orientation ratio and an amount of strain with respect to the piezoelectric element according to the embodiment and the piezoelectric elements according to the first and second comparative examples. Herein, samples on which a high temperature aging test is performed at 250° C. after manufacture and thereafter subjected to a polarization treatment and samples on which no high temperature aging test is performed after manufacture and subjected to a polarization treatment are evaluated. Note that the c-axis domain orientation ratio in FIG. 8 is a value obtained by measuring a c-axis diffraction intensity Ic of crystals and an a-axis diffraction intensity Ia of the crystals by performing X-ray diffraction on the ceramic substrate 12 of each piezoelectric element and substituting the Ia and Ic to a following formula for calculation: $I_c/(Ia+Ic)$. High c-axis domain orientation ratio indicates that there exist many crystals having a c-axis oriented along the direction in which electric field is applied in the ceramic substrate 12. Accordingly, high c-axis domain orientation ratio means that it is less likely to cause domain rotation of the crystals in the ceramic substrate 12 and an amount to strain the ceramic substrate 12 when electric field is applied is small. It is known that the c-axis domain orientation ratio becomes large when a compressive stress generating in the ceramic element is large. Note that the c-axis domain orientation ratio indicates characteristics of only the ceramic substrate 12. Actual flexibility of each of the piezoelectric elements varies depending on the structure of not only the ceramic substrate 12 but also the structure of the electrodes 14 and 16. The amount of strain in FIG. 8 was measured by applying a predetermined voltage between the electrodes 14 and 16 of each piezoelectric element and detecting the amount of strain in the X direction (amount of variation in size). The amount of strain in FIG. 8 is a value showing flexibility of the piezoelectric element.

First, characteristics of each piezoelectric element on which no high temperature aging test is performed will be described. As illustrated in FIG. 8, although the c-axis domain orientation ratio of the sample on which no high temperature aging test is performed of the piezoelectric element according to the embodiment is far higher than that of the piezoelectric element according to the first comparative example, the amount of strain of the sample on which no high temperature aging test is performed of the piezoelectric element according to the embodiment is larger than that of the piezoelectric element according to the first comparative example. That is, in the samples on which no high temperature aging test is performed, although the amount to strain the ceramic substrate 12 of the piezoelectric element according to the embodiment is smaller than that of the piezoelectric element according to the first comparative example, an actual amount of strain of the piezoelectric element according to the embodiment is larger than that of the piezoelectric element according to the first comparative example. It is considered that this is due to the difference in the structure of the electrodes. That is, in the piezoelectric element according to the first comparative example, the electrodes 14 and 16 are in close contact with the ceramic substrate 12 and the electrodes 14 and 16 are dense. Therefore, strain of the ceramic substrate 12 is interrupted by the electrodes 14 and 16. On the other hand, in the piezoelectric element according to the embodiment, since the voids 30 and microscopic voids 40 are formed on and inside each of the electrodes 14 and 16, the electrodes 14 and 16 are readily expanded and shrunk together with the strain of the ceramic substrate 12. Accordingly, the amount of strain becomes large in the piezoelectric element of the embodiment. Note that although the c-axis domain orientation ratio of the piezoelectric element according to the second comparative example on which the high temperature aging test has been performed is slightly higher than that of the piezoelectric element according to the embodiment, the amount of strain of the piezoelectric element according to the second comparative example is far smaller than that of the piezoelectric element according to the embodiment. It is considered that this is also due to the difference in the structure of the electrodes (that is, the electrodes 14 and 16 of the piezoelectric element according to the second comparative example are dense).

The c-axis domain orientation ratio of the sample on which no high temperature aging test is performed is high in the piezoelectric element according to the embodiment and the piezoelectric element according to the second comparative example. It is considered that this is because the ceramic substrate 12 is heated during forming the electrodes 14 and 16 in a manufacturing process of the piezoelectric elements according to the embodiment and the second comparative example. That is, when heat is applied to the ceramic substrate 12 when the electrodes 14 and 16 are formed in the manufacturing process, the ceramic substrate 12 is thermally expanded. The electrodes 14 and 16 are fixed on the ceramic substrate 12 which is in a thermally expanded state, and the ceramic substrate 12 and the electrodes 14 and 16 are united. Then, when the united ceramic substrate 12 and the electrodes 14 and 16 are cooled to a normal temperature, the united ceramic substrate 12 and the electrodes 14 and 16 are shrunk together. Since the electrodes 14 and 16 which are metal materials have a rate of thermal expansion larger than that of the ceramic substrate 12, an amount of shrinkage of the electrodes 14 and 16 becomes larger than an amount of shrinkage of the ceramic substrate 12. Accordingly, when the piezoelectric element is cooled from the temperature at which the electrodes 14 and 16 and the ceramic substrate 12 are fixed to a normal temperature, a compressive stress occurs in the ceramic substrate 12. It is considered that this increases the c-axis domain orientation ratio before polarization treatment in the piezoelectric elements according to the embodiment and the second comparative example. Note that in the manufacturing process, the temperature to which the electrodes 14 and 16 of the piezoelectric element according to the embodiment are exposed is about 600° C. On the other hand, the temperature to which the electrodes 14 and 16 of the piezoelectric element according to the second comparative example are exposed is about 230° C., which is lower than that in the embodiment. However, the c-axis domain orientation ratio of the piezoelectric element according to the embodiment is lower than that of the piezoelectric element according to the second comparative example. It is considered that this is because the compressive stress which occurs in the ceramic substrate 12 is suppressed by detachment of the electrodes 14 and 16 from the bottom of the groove 20 of the ceramic substrate 12 and formation of the microscopic voids 40 inside the electrodes 14 and 16 in the manufacturing process of the piezoelectric element according to the embodiment. Furthermore, the piezoelectric element on which no high temperature aging test is performed according to the first comparative example has a c-axis domain orientation ratio which is extremely low. It is considered that this is because a compressive stress in the ceramic substrate 12 caused by the above-described difference in thermal expansion does not occur since the ceramic substrate 12 is not heated in the manufacturing process in the piezoelectric element according to the first comparative example.

Next, a change in characteristics of each piezoelectric element caused by the high temperature aging test will be described. The c-axis domain orientation ratio of the sample on which the high temperature aging test has been performed of the piezoelectric element according to the first comparative example is far higher than that of the sample on which no high temperature aging test is performed of the piezoelectric element according to the first comparative example. It is considered that this is because since the electrodes 14 and 16 of the piezoelectric element according to the first comparative example are not exposed to a high temperature in the manufacturing process, large atoms are rearranged such that Au atoms in the electrodes 14 and 16 become a close state during the high temperature aging test, which shrinks the electrodes 14 and 16. That is, shrinkage of the electrodes 14 and 16 during the high temperature aging test generates a compressive stress in the ceramic substrate 12 to increase the c-axis domain orientation ratio. Note that, in the piezoelectric element according to the first comparative example, since the whole of the electrodes 14 and 16 are in close contact with the ceramic substrate 12, the whole of each of the electrodes 14 and 16 shrinks toward a center thereof as shown by the arrows in FIG. 6. Furthermore, a force caused by shrinkage of each of the electrodes 14 and 16 is directly transmitted to the ceramic substrate 12 since no microscopic void is formed inside the electrodes 14 and 16. Consequently, a very high compressive stress is to be applied to the ceramic substrate 12. As a result, the c-axis domain orientation ratio of the piezoelectric element according to the first comparative example is largely increased by the high temperature aging test.

The c-axis domain orientation ratio of the sample on which the high temperature aging test has been performed is larger than that of the sample on which no high temperature aging test is performed also in the piezoelectric element according to the second comparative example although not so obvious as in the first comparative example. It is considered that atoms are rearranged such that Au atoms becomes a close state by the high temperature aging test to be shrunk to some extent also in the electrodes 14 and 16 according to the second comparative example subjected to a heat treatment of 230° in the manufacturing process.

On the other hand, the c-axis domain orientation ratio of the sample on which no high temperature aging test is performed is approximately equal to that of the sample on which the high temperature aging test has been performed in the piezoelectric element according to the embodiment. It is considered that this is due to operations of the voids 30 and microscopic voids 40 on and inside the electrodes 14 and 16 according to the embodiment. That is, in the piezoelectric element according to the embodiment, the electrodes 14 and 16 are not in contact with the ceramic substrate 12 at the bottoms of the grooves 20 due to the formation of the voids 30. Consequently, as shown by the arrows in FIG. 2, the electrodes 14 and 16 in areas surrounded by the grooves 20 are less likely to be shrunk in such a manner as to cross the grooves 20. Furthermore, since the microscopic voids 40 are formed inside each of the electrodes 14 and 16, the electrodes 14 and 16 are readily deformed to some extent. Furthermore, since the parts of each of the electrodes 14 and 16 crossing the grooves 20 are not in contact with the ceramic substrate 12 and the volume ratio of the microscopic voids 40 of the parts is high, the ceramic substrate 12 can be deformed more flexibly. Accordingly, it is considered that a compressive stress is less likely to be acted on the ceramic substrate 12 even when the electrodes 14 and 16 are shrunk due to the rearrangement of Au atoms. Furthermore, the electrodes 14 and 16 according to the embodiment are exposed to a temperature of 600° C. in the manufacturing process. Accordingly, it is considered that the amount of shrinkage of the electrodes 14 and 16 caused by the rearrangement of Au atoms during the high temperature aging test is small as compared with the first and second comparative examples. It is considered that this also makes it difficult that the compressive stress is applied on the ceramic substrate 12. As described above, in the piezoelectric element according to the embodiment, there is almost no change in the c-axis domain orientation ratio by the high temperature aging test. Accordingly, among the samples on which the high temperature aging test has been performed, the c-axis domain orientation ratio of the piezoelectric element according to the embodiment becomes the lowest.

As described above, in the piezoelectric elements according to the first and second comparative examples, since the c-axis domain orientation ratio is increased by the high temperature aging test, the amount of strain is decreased by the high temperature aging test. On the other hand, in the piezoelectric element according to the embodiment, since the c-axis domain orientation ratio is hardly changed by the high temperature aging test, the amount of strain is hardly changed by the high temperature aging test. In this manner, in the piezoelectric element according to the embodiment, the characteristics are hardly changed even when exposed to a high temperature after manufacture. The piezoelectric element according to the embodiment is extremely stable with respect to temperature. Therefore, among the samples on which the high temperature aging test has been performed, the amount of strain of the piezoelectric element according to the embodiment becomes obviously larger than the amount of strain of the piezoelectric element according to the first or second comparative example.

As described above, in the piezoelectric element according to the embodiment, voids 30 are formed between the respective bottoms of the grooves 20 and the electrodes 14 and 16, so that the electrodes 14 and 16 at upper parts of the voids 30 can be flexibly deformed. Furthermore, since many microscopic voids 40 are formed inside each of the electrodes 14 and 16, the whole of each of the electrodes 14 and 16 can be flexibly deformed. Furthermore, since the volume ratio of the microscopic voids 40 inside the electrodes 14 and 16 at the parts crossing the respective grooves 20 is high, the electrodes 14 and 16 can be flexibly deformed especially at the parts. Accordingly, the electrodes 14 and 16 are less likely to interrupt the strain of the ceramic substrate 12. Therefore, the amount of strain of the piezoelectric element is large. Furthermore, since the electrodes 14 and 16 can be flexibly deformed, a compressive stress is less likely to occur in the ceramic substrate 12 even when the electrodes 14 and 16 are shrunk by heat. Consequently, the piezoelectric element according to the embodiment is less likely to be decreased in the amount of the strain even when exposed to a high temperature. Furthermore, since the electrodes 14 and 16 of the piezoelectric element according to the embodiment are exposed to a high temperature in the manufacturing process, the piezoelectric element is less likely to be shrunk even when exposed to a high temperature thereafter. This also makes it difficult to decrease the amount of the strain of the piezoelectric element according to the embodiment when exposed to a high temperature.

Furthermore, in the manufacturing method according to the embodiment, when the electrodes 14 and 16 are exposed to a high temperature, the electrodes 14 and 16 are shrunk and detached from the bottoms of the grooves 20. Accordingly, although the electrodes 14 and 16 are exposed to a high temperature in the manufacturing process (that is, although the electrodes 14 and 16 are shrunk), a high compressive stress does not occur in the ceramic substrate 12. Consequently, according to the manufacturing method, a piezoelectric element having a large amount of strain and having characteristics that are less likely to be changed even when exposed to a high temperature can be manufactured.

Note that the voids 30 and microscopic voids 40 are not necessarily formed on and inside the whole of the electrodes 14 and 16. Even when the voids 30 and microscopic voids 40 are partially formed on and inside the electrodes 14 and 16, the above-described effects can be obtained at the parts. Furthermore, in a case where the voids 30 and microscopic voids 40 are formed on any one of the electrodes 14 and 16, the above-described effects can be obtained.

Figure 9:
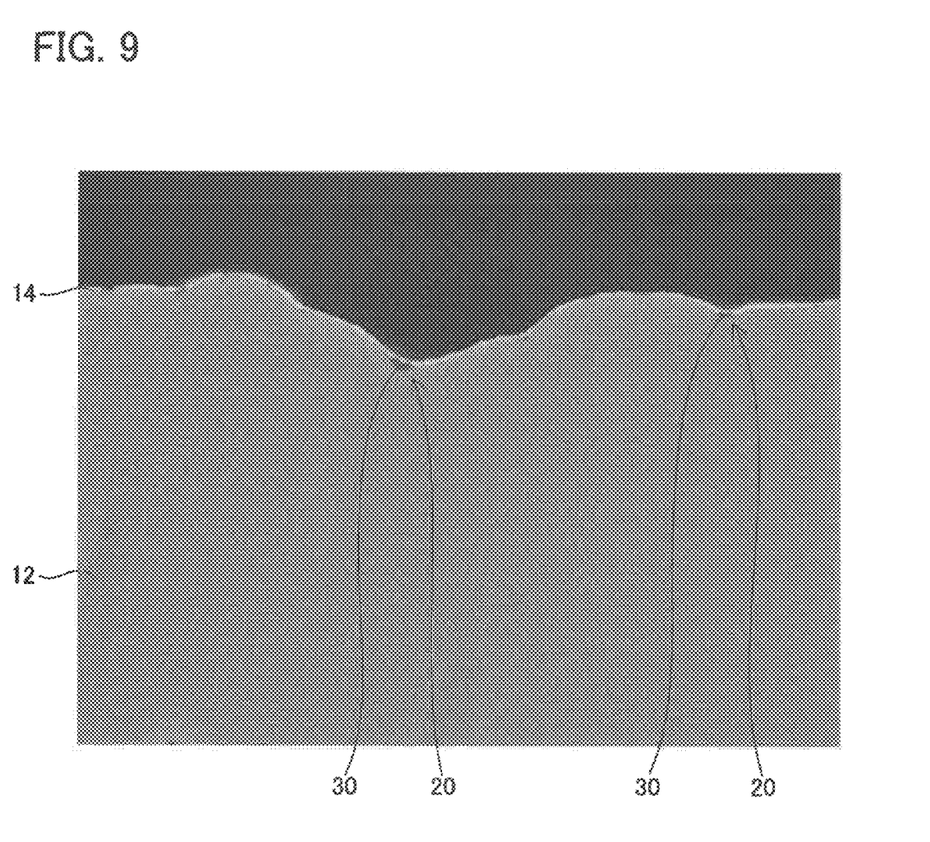
FIG. 9 shows an electron microscopic photograph of a cross section of a boundary between an electrode 14 and a ceramic substrate 12 of a piezoelectric element in a modified example.

Furthermore, in step 2 of FIG. 5, by shaping a green sheet on a carrier tape having a surface subjected to roughening treatment, a surface state of the carrier tape may be transferred on the green sheet. Then, the piezoelectric element having the ceramic substrate 12 having a roughened surface as shown in FIG. 9 can be manufactured by performing each manufacturing process in the same manner as the embodiment. Note that, the surface roughness Ra of the ceramic substrate 12 as shown in FIG. 9 is about 0.1 micrometers to 1.0 micrometer. The voids 30 are formed along the respective grooves 20 of the grain boundary also in the structure as shown in FIG. 9.

Furthermore, in the above-described manufacturing method according to the embodiment, the voids 30 are formed on the respective grooves 20 of the surface that is fired (that is, the grooves 20 extending along grain boundary). Alternatively, grooves for forming the voids 30 may be formed by processing. For example, minute grooves may be formed on the surface of the ceramic substrate 12 by mechanical processing (polishing, cutting, or the like). Then, performing the step S6 and step S8 similar to the embodiment forms the voids 30 on the grooves formed by the mechanical processing. Alternatively, grooves may be formed by pressing a forming die on a surface of a green sheet in step 2 of FIG. 5. By firing the green sheet on which the grooves are formed, the ceramic substrate 12 having the grooves on the surface can be obtained. Performing step S6 and step S8 thereafter similar to the embodiment forms the voids 30 on the respective grooves formed by the forming die.

In the above-described embodiment, the case where the thickness of the electrodes 14 and 16 is 100 nanometers to 370 nanometers is described. With such a thickness of the electrodes 14 and 16, generation of compressive stress in the ceramic substrate 12 can be effectively suppressed. Note that the electrodes 14 and 16 having a thickness of 50 nanometers to 500 nanometers enable to suppress generation of compressive stress in the ceramic substrate 12.

In step S8 in the above-described embodiment, the ceramic substrate is heat treated at a temperature of about 600° C. However, heat treatment may be performed at another temperature. However, when the heat treating temperature exceeds 750° C., the electrode at a crossing part extending over the groove may be fractured due to shrinkage of the electrode. Furthermore, when the heat treating temperature is lower than 550° C., connecting strength between the electrode and the ceramic substrate may be weakened. Accordingly, it is preferable that the heat treating temperature is 550° C. or more and 750° C. or less.

What is claimed is:

1. A piezoelectric element comprising:
a ceramic substrate including a first surface on which a first groove is formed; and
a first electrode formed on the first surface of the ceramic substrate, and including a crossing part that extends over the first groove, wherein
at least one first void is formed between a bottom of the first groove and the crossing part of the first electrode, and
microscopic voids smaller than the at least one first void are formed inside the first electrode.

2. The piezoelectric element according to claim 1, wherein:
a volume ratio of the microscopic voids inside the first electrode at the crossing part is higher than the volume ratio of the microscopic voids inside the first electrode at a part other than the crossing part.

3. The piezoelectric element according to claim 2, wherein:
a thickness of the first electrode is 50 nanometers or more and 500 nanometers or less.

4. The piezoelectric element according to claim 3, wherein:
the first groove is formed along a boundary between crystal grains which are exposed on the first surface of the ceramic substrate.

5. The piezoelectric element according to claim 4, wherein:
the ceramic substrate further includes a second surface opposite to the first surface,
a second groove is formed on the second surface,
the piezoelectric element further comprises a second electrode formed on the second surface of the ceramic substrate, and including a crossing part that extends over the second groove on the second surface, wherein:
at least one second void is formed between a bottom of the second groove on the second surface and the crossing part of the second electrode.

6. The piezoelectric element according to claim 5, wherein:
the piezoelectric element is used as an actuator which makes use of a strain in a d 31 direction.

7. The piezoelectric element according to claim 1, wherein:
a thickness of the first electrode is 50 nanometers or more and 500 nanometers or less.

8. The piezoelectric element according to claim 1, wherein:
the first groove is a groove that is formed on a surface of the ceramic substrate that is fired when the ceramic substrate is fired.

9. The piezoelectric element according to claim 8, wherein:
the first groove is formed along a boundary between crystal grains which are exposed on the first surface of the ceramic substrate.

10. The piezoelectric element according to claim 1, wherein:
the first groove is formed along a boundary between crystal grains which are exposed on the first surface of the ceramic substrate.

11. The piezoelectric element according to claim 1, wherein:
the piezoelectric element is used as an actuator which makes use of a strain in a d 31 direction.

12. The piezoelectric element according to claim 1, wherein:
the ceramic substrate further includes a second surface opposite to the first surface,
a second groove is formed on the second surface,
the piezoelectric element further comprises a second electrode formed on the second surface of the ceramic substrate, and including a crossing part that extends over the second groove on the second surface, wherein:
at least one second void is formed between a bottom of the second groove on the second surface and the crossing part of the second electrode.

13. A piezoelectric element comprising:
a ceramic substrate including a first surface on which a first groove is formed; and
a first electrode formed on the first surface of the ceramic substrate, and including a crossing part that extends over the first groove, wherein
microscopic voids are formed inside the first electrode, and
a volume ratio of the microscopic voids inside the first electrode at the crossing part is higher than the volume ratio of the microscopic voids inside the first electrode at a part other than the crossing part.

14. The piezoelectric element according to claim 13, wherein:
a thickness of the first electrode is 50 nanometers or more and 500 nanometers or less.

15. The piezoelectric element according to claim 14, wherein:
the ceramic substrate further includes a second surface opposite to the first surface,
a second groove is formed on the second surface,
the piezoelectric element further comprises a second electrode formed on the second surface of the ceramic substrate, and including a crossing part that extends over the second groove on the second surface, wherein:
microscopic voids are formed inside the second electrode, and
a volume ratio of the microscopic voids inside the second electrode at the crossing part is higher than the volume ratio of the microscopic voids inside the second electrode at a part other than the crossing part.

16. A method for manufacturing the piezoelectric element of claim 1, the method comprising:
forming an electrode on a surface of a ceramic substrate, wherein a groove is formed on the surface of the ceramic substrate, and the electrode is formed such that the electrode includes a crossing part that extends over the groove;
detaching the crossing part of the electrode from the bottom of the groove by heating the ceramic substrate, and forming at least one void between a bottom of the groove and the crossing part of the electrode,
wherein microscopic voids smaller than the at least one void are formed inside the electrode.

\* \* \* \* \*